(12) United States Patent
Su et al.

(10) Patent No.: US 11,502,265 B2
(45) Date of Patent: Nov. 15, 2022

(54) QUANTUM DOT WHITE LIGHT DIODE

(71) Applicant: TCL TECHNOLOGY GROUP CORPORATION, Huizhou (CN)

(72) Inventors: Liang Su, Huizhou (CN); Xiangwei Xie, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 396 days.

(21) Appl. No.: 16/954,417

(22) PCT Filed: Sep. 24, 2019

(86) PCT No.: PCT/CN2019/107468
§ 371 (c)(1),
(2) Date: Jun. 16, 2020

(87) PCT Pub. No.: WO2020/063571
PCT Pub. Date: Apr. 2, 2020

(65) Prior Publication Data
US 2021/0083216 A1    Mar. 18, 2021

(30) Foreign Application Priority Data

Sep. 25, 2018   (CN) .......................... 201811115308.5
Sep. 25, 2018   (CN) .......................... 201811115321.0

(51) Int. Cl.
*H01L 51/50*        (2006.01)
(52) U.S. Cl.
CPC ........ *H01L 51/502* (2013.01); *H01L 51/5016* (2013.01); *H01L 51/5024* (2013.01); *H01L 51/5056* (2013.01); *H01L 51/5072* (2013.01)
(58) Field of Classification Search
CPC ............... H01L 51/502; H01L 51/5016; H01L 51/5024; H01L 51/5056; H01L 51/5072; H01L 51/5012; H01L 51/5036
See application file for complete search history.

(56) References Cited

U.S. PATENT DOCUMENTS

2008/0284317 A1* 11/2008 Liao ..................... H01L 51/5036
                                                    313/504
2009/0230844 A1*  9/2009 Pfeiffer ............... H01L 51/5016
                                                    313/504
(Continued)

FOREIGN PATENT DOCUMENTS

CN          102136550 A       7/2011
CN          102651452 A       8/2012
(Continued)

OTHER PUBLICATIONS

The World Intellectual Property Organization (WIPO) International Search Report for PCT/CN2019/107468 dated Nov. 13, 2019 5 Pages.

(Continued)

*Primary Examiner* — Omar F Mojaddedi
(74) *Attorney, Agent, or Firm* — Anova Law Group, PLLC

(57) ABSTRACT

A quantum dot white light-emitting diode includes a cathode, an anode, and a light-emitting layer disposed therebetween. The light-emitting layer includes: a blue fluorescent organic layer, a spacer layer, and a quantum dot light-emitting layer. The blue fluorescent organic layer is disposed near the cathode side, the quantum dot light-emitting layer is disposed near the anode side, and the spacer layer is disposed between the blue fluorescent organic layer and the quantum dot light-emitting layer. A material of the quantum dot light-emitting layer contains quantum dots, a material of the blue fluorescent organic layer contains a blue fluorescent organic material, and a material of the spacer layer contains a spacer material. A triplet exciton energy of the spacer material is greater than a triplet exciton energy of the blue fluorescent organic material, and a triplet exciton energy of (Continued)

the spacer material is greater than a quantum dot exciton energy.

20 Claims, 3 Drawing Sheets

(56) References Cited

U.S. PATENT DOCUMENTS

| | | | | |
|---|---|---|---|---|
| 2018/0047926 | A1* | 2/2018 | Tanaka | H01L 51/5056 |
| 2018/0061901 | A1* | 3/2018 | Zhang | H01L 51/504 |
| 2019/0036058 | A1* | 1/2019 | Thompson | H01L 51/0072 |
| 2019/0237694 | A1* | 8/2019 | Thompson | H01L 51/0072 |

FOREIGN PATENT DOCUMENTS

| | | |
|---|---|---|
| CN | 103500803 A | 1/2014 |
| CN | 105552245 A | 5/2016 |
| CN | 105591035 A | 5/2016 |
| CN | 105826481 A | 8/2016 |
| CN | 106784358 A | 5/2017 |
| CN | 106848080 A | 6/2017 |
| CN | 106997889 A | 8/2017 |
| CN | 106997926 A | 8/2017 |
| CN | 107331782 A | 11/2017 |
| CN | 107452884 A | 12/2017 |
| JP | 2014135445 A | 7/2014 |
| WO | 2014057971 A1 | 4/2014 |
| WO | 2016041802 A1 | 3/2016 |
| WO | 2018001000 A1 | 1/2018 |

OTHER PUBLICATIONS

An, Na et al., "Synthesis of CdSe/CdS Core/Shell Quantum Dots Luminescent Microspheres and Their Application for WLEDs", Chinese Journal of Luminescence, vol. 38, No. 8, Aug. 2017.

Abdurahman, Alim et al., "Efficient deep blue fluorescent OLEDs with ultra-low efficiency roll-off based on 4H-1,2,4-triazole cored D-A and D-A-D type emitters", Dyes and Pigments 153 (2018) 10-17.

Zhang, Y.Q. et al., "Electroluminescence of green CdSe/ZnS quantum dots enhanced by harvesting excitons from phosphorescent molecules", Appl. Phys. Lett. 97, 253115 (2010).

Cao, Jin et al., "Bright hybrid white light-emitting quantum dot device with direct charge injection into quantum dot", Chin. Phys. B vol. 25, No. 12 (2016) 128502.

* cited by examiner

QUANTUM DOT WHITE LIGHT DIODE

CROSS-REFERENCE TO RELATED APPLICATION

This application is a National Stage entry under 35 U.S.C. § 371 of International Application No. PCT/CN2019/107468, filed on Sep. 24, 2019, which claims priority to Chinese Patent Application Nos. 201811115321.0 and 201811115308.5, both filed on Sep. 25, 2018, the entire content of which is incorporated herein by reference.

TECHNICAL FIELD

The present disclosure relates to the field of light-emitting diodes, and in particular relates to a quantum dot white light-emitting diode.

BACKGROUND TECHNOLOGY

At present, white light diodes are widely used in the field of display and lighting. They are mainly divided into inorganic white light diodes and organic or quantum dot white light-emitting diodes. The most significant difference between the two is that inorganic white light-emitting diodes emit light from luminous points, while organic or quantum-dot white light-emitting diodes emit light from luminous surface. This promotes the diversified development of display and lighting apparatus and application scenarios and brings imagination and convenience to life.

In surface luminescence technology, bright and delicate color of quantum dots and the easy adjustment are unique advantages of quantum dot white light-emitting diodes in the field of display and lighting. For example, they can realistically display or restore the original appearance of objects, which gives people a visual shock and pleasure.

After nearly thirty years of development, great progress has been made in red and green single-color quantum dot light-emitting diodes in terms of efficiency and life span, which has reached commercial standards. However, the life span of blue-light quantum dot light-emitting diodes is far behind. Therefore, in order to achieve efficient and stable long-life quantum dot white light-emitting diodes, it is urgent to find a suitable blue light alternative material.

Prior to this, the industry has proposed the use of blue organic materials combined with red and green quantum dots to achieve white light. However, phosphorescent materials or thermally activated delayed fluorescent (TADF) materials have been widely used as blue substances in these cases. Despite high luminous efficiency of these substances, their life span still does not meet commercialization requirement thus making it difficult to achieve the goal of long life span. Often, the cases of combining blue organic fluorescent substances with red and green quantum dots are just a concept, yet no feasible implementation plans have been given.

For blue organic fluorescent light-emitting diodes, the advantages are the good stability and long life span, which meet commercialization requirements, but the shortcoming is the low luminous efficiency. This is because radiative recombination only occurs in singlet excitons in the organic fluorescent material to emit blue light, and triplet excitons return to the ground state in the form of non-radiative recombination, and the ratio of singlet excitons to triplet excitons is 1:3. Accordingly, a theoretical maximum internal quantum efficiency of blue organic fluorescent light-emitting diodes may be only 25%, which is far from the 100% internal quantum efficiency we are pursuing. Apparently, for white light diodes that combine blue organic phosphors with red and green quantum dots, such inefficient blue light emission severely restricts the internal quantum efficiency of white light diodes.

Therefore, the existing technology needs to be improved and further developed.

SUMMARY OF THE DISCLOSURE

In view of the above shortcomings of the existing technology, the purpose of the present disclosure is to provide a quantum dot white light-emitting diode that aims to solve the problems of low internal quantum efficiency in existing blue organic fluorescent light-emitting diodes that severely restricts the luminous efficiency of quantum dot white light-emitting diodes.

The technical solutions of the present disclosure are as follows.

According to some embodiments of the present disclosure, a quantum dot white light-emitting diode includes a cathode, an anode, and a light-emitting layer disposed between the cathode and the anode. The light-emitting layer includes a blue fluorescent organic layer, a spacer layer, and a quantum dot light-emitting layer that are stacked. The blue fluorescent organic layer is disposed near the cathode side, the quantum dot light-emitting layer is disposed near the anode side, the spacer layer is disposed between the blue fluorescent organic layer and the quantum dot light-emitting layer. A material of the quantum dot light-emitting layer contains quantum dots, a material of the blue fluorescent organic layer contains a blue organic fluorescent material, and a material of the spacer layer contains a spacer material. A triplet exciton energy of the spacer material is greater than a triplet exciton energy of the blue organic fluorescent material, and a triplet exciton energy of the spacer material is greater than an exciton energy of the quantum dot.

According to some embodiments of the present disclosure, a quantum dot white light-emitting diode includes a cathode, an anode, and a light-emitting layer disposed between the cathode and the anode. The light-emitting layer includes a blue fluorescent organic layer and a quantum dot light-emitting layer. The blue fluorescent organic layer material includes a first host material formed by mixing a first p-type semiconductor material and a first n-type semiconductor material, and a blue organic fluorescent material doped in the first host material. A singlet exciton energy of the first host material is greater than a singlet exciton energy of the blue organic fluorescent material, and a triplet exciton energy of the first host material is greater than a triplet exciton energy of the blue organic fluorescent material.

The benefit effect of the disclosure is, a spacer layer having electron and hole transport capabilities is disposed between the blue fluorescent organic layer and the quantum dot light-emitting layer of the light-emitting layer, and the spacer layer can prevent quantum dot transfer of the singlet excitons of the blue fluorescent organic layer material, so that singlet excitons can be completely used to produce blue light, and the spacer layer can also cause the triplet excitons of the blue organic light-emitting layer to diffuse to the quantum dot light-emitting layer and photosensitize the quantum dots to emit light. Accordingly, quantum efficiency of the quantum dot white light-emitting diode can be effectively improved.

DETAILED DESCRIPTION OF THE EMBODIMENTS

The present disclosure provides a quantum dot white light-emitting diode. In order to make the purpose, technical solutions and effects of the present disclosure clearer and more specific, the present disclosure will be described below in further detail. It should be understood that the specific embodiments described herein are only used to explain the disclosure and are not intended to limit the disclosure.

Figure 1:
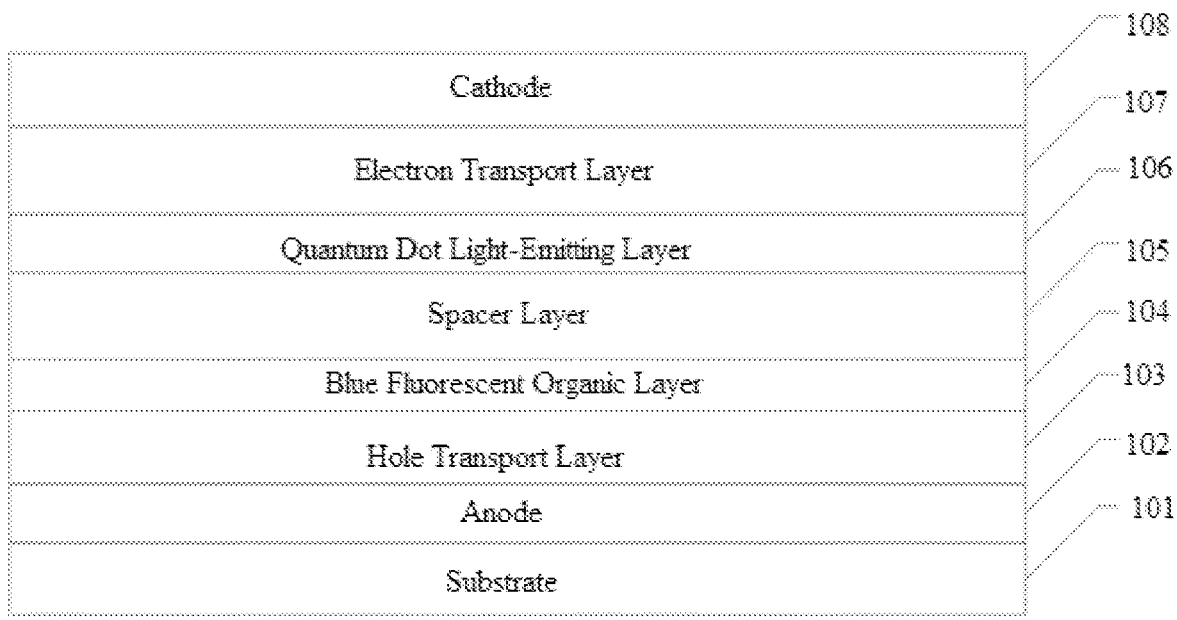
FIG. 1 is a schematic structural diagram of a quantum dot white light-emitting diode according to an embodiment of the present disclosure.

There are various forms of quantum dot light-emitting diodes, and the quantum dot light-emitting diodes can be divided into a regular structure type and an inverted structure type. The inverted structure quantum dot white light-emitting diode may include a substrate, a cathode, an electron transport layer, a blue fluorescent organic layer, a quantum dot light-emitting layer, a spacer layer, a hole transport layer, and an anode that are stacked from bottom to top. In specific implementations of the present disclosure, quantum dot white light-emitting diodes with regular structure as shown in FIG. 1 will be mainly used as an example for illustration. Specifically, as shown in FIG. 1, a quantum dot white light-emitting diode with regular structure includes a substrate 101, an anode 102, a hole transport layer 103, a blue fluorescent organic layer 104, a spacer layer 105, a quantum dot light-emitting layer 106, an electron transport layer 107, and a cathode 108. A material of the quantum dot light-emitting layer contains quantum dots, a material of the blue fluorescent organic layer contains blue organic fluorescent material, and a material of the spacer layer contains spacer material. A triplet exciton energy of the spacer layer material is greater than a triplet exciton energy of the blue organic fluorescent material, and the triplet exciton energy of the spacer layer material is greater than a quantum dot exciton energy.

In this embodiment, a spacer layer having both electron transport capability and hole transport capability may be disposed between the blue fluorescent organic layer and the quantum dot light-emitting layer, which can effectively improve luminous efficiency of the quantum dot white light-emitting diode.

The mechanism for achieving the above effects is as follows:

In order to ensure that the blue fluorescent organic layer and the quantum dot light-emitting layer in this embodiment can emit light stably, the spacer layer must transmit electrons injected from the cathode to the blue fluorescent organic layer and holes injected from the anode to the quantum dot light-emitting layer. The spacer layer material is a material having both electron transport capability and hole transport capability. At the same time, to avoid the triplet excitons of the blue fluorescent organic layer and the quantum dot excitons in the quantum dot light-emitting layer being quenched by the spacer layer, the triplet exciton energy of the spacer layer material should be greater than the triplet exciton energy of the blue organic fluorescent material in the blue fluorescent organic layer, and the triplet exciton energy of the spacer layer material should also be greater than the quantum dot exciton energy of quantum dots in the light-emitting layer. The spacer layer in this embodiment can prevent the singlet excitons in the blue fluorescent organic layer from transferring, so that the singlet excitons can be used to produce blue light. The spacer layer can also cause the triplet excitons of the blue organic light-emitting layer to diffuse to the quantum dot light-emitting layer and photosensitize the quantum dots to emit light, thereby effectively improving luminous efficiency of the quantum dot white light-emitting diode.

It should be noted that the quantum dot white light-emitting diode with the regular structure can also include the substrate, the anode, the hole transport layer, the quantum dot light-emitting layer, the spacer layer, the blue fluorescent organic layer, the electron transport layer, and the cathode, that are stacked from the bottom to the top. The spacer material is a material having both the electron transport capability and the hole transport capability. The triplet exciton energy of the spacer material is greater than the triplet exciton energy of the blue organic fluorescent material in the blue fluorescent organic layer, and the triplet exciton energy of the spacer material is greater than the quantum dot exciton energy in the quantum dot light-emitting layer. The quantum dot white light-emitting diode with this structure can also improve its luminous efficiency, and the mechanism for achieving the above effect is the same as the above embodiment.

In some embodiments, singlet excitons generally transfer exciton energy through Förster (Fluorescence) energy transfer, and its effective radius of action is usually between 3-5 nm, while triplet excitons have long life spans and their exciton diffusion length can reach 100 nm. In this embodiment, a thickness of the spacer layer is set to 3-100 nm, so that it can effectively prevent the singlet excitons in the blue fluorescent organic layer from transferring to the quantum dot light-emitting layer, and it is convenient for the triplet excitons to diffuse to the quantum dot to light-emitting layer and photosensitize the quantum dots to emit light. By setting the thickness of the spacer layer to be 3-100 nm, the quantum efficiency of quantum dot white light-emitting diodes can be effectively improved.

More preferably, the thickness of the spacer layer is 3-10 nm. Within this thickness range, the spacer layer can also effectively block the singlet excitons of the blue fluorescent organic layer material from transferring to the quantum dot light-emitting layer, and is more favorable to the diffusion of the triplet excitons of the blue fluorescent organic layer material into the quantum dot light-emitting layer and the photosensitization of the quantum dot for light emitting, which can further improve the luminous efficiency of the quantum dot white light-emitting diode.

In some embodiments, to ensure that the mobilization of electrons and holes between the blue fluorescent organic layer and the quantum dot light-emitting layer cannot be affected, the spacer material may be a first bipolar material having both electron transport capability and hole transport capability. In some embodiments, the first bipolar material may include at least one of: CBP and NPB, but is not limited thereto. In some embodiments, the first bipolar material includes one component, such as one of: CBP and NPB; in some embodiments, the first bipolar material includes two components, such as CBP and NPB. In some specific embodiments, the first bipolar material is CBP. Since the hole transport capability and the electron transport capability of CBP are similar, and are $10^{-3}$ cm$^2$V$^{-1}$ S$^{-1}$ and $10^{-4}$ cm$^2$V$^{-1}$ S$^{-1}$, respectively, the similar hole transport capability and electron transport capability can ensure the transfer and balance of charges, reduce the accumulation of charges in the light-emitting layer, and help to improve the luminous efficiency of quantum dot light-emitting diodes and maintain spectrum stability; more importantly, the triplet exciton energy of the CBP T1 is 2.56 eV, which is higher than exciton energy of red, yellow, and green quantum dots and triplet exciton energy of common blue organic fluorescent materials. In some embodiments, to ensure that the mobilization of electrons and holes between the blue fluorescent organic layer and the quantum dot light-emitting layer cannot be affected, the spacer material may be a mixed material composed of a first n-type semiconductor material and a first p-type semiconductor material. In some embodiments, the first n-type semiconductor material includes at least one of: TPBi (T1=2.75 eV), Bepp2 (T1=2.60 eV), BTPS (T1=2.79 eV) and TmPyPb (T1=2.78 eV). In some embodiments, the first n-type semiconductor material includes one component, such as one of: TPBi, Bepp2, BTPS, and TmPyPb. In some embodiments, the first n-type semiconductor material includes two components, such as TPBi and Bepp2, Bepp2 and BTPS, BTPS and TmPyPb. In some embodiments, the first n-type semiconductor material includes three components, such as TPBi, Bepp2 and BTPS, Bepp2, or, BTPS and TmPyPb, or, TPBi, Bepp2 and TmPyPb. In some embodiments, the first n-type semiconductor material includes four components, such as TPBi, Bepp2, BTPS, and TmPyPb. In some embodiments, the first p-type semiconductor material includes at least one of: TAPC (T1=2.98 eV), mCP (T1=2.91 eV), and TCTA (T1=2.76 eV). In some embodiments, the first p-type semiconductor material includes one component, such as one of: TAPC, mCP, and TCTA. In some embodiments, the first p-type semiconductor material includes two components, such as TAPC and mCP, TAPC and TCTA, or, mCP and TCTA. In some embodiments, the first p-type semiconductor material includes three components, such as TAPC, mCP and TCTA. T1 refers to the triplet exciton energy of the semiconductor material. For example, the mixed material composed of the first n-type semiconductor material and the first p-type semiconductor material may be one of: TCTA: TPBi, TCTA: TmPyPb, and mCP: TmPyPb, but is not limited thereto.

In some embodiments, the blue fluorescent organic layer may include a first host material and a blue organic fluorescent material doped in the first host material. The first host material is one of: a second bipolar material, a second n-type semiconductor material, a second p-type semiconductor material, and a mixed material composed of the second n-type semiconductor material and the second p-type semiconductor material. In order to prevent the singlet excitons and the triplet excitons of the blue organic fluorescent material from being quenched by the first host material, the singlet exciton energy of the first host material is greater than the singlet exciton energy of the blue organic fluorescent material, and the triplet exciton energy of the first host material is greater than the triplet exciton energy of the blue organic fluorescent material.

In some embodiments, the first host material in the blue fluorescent organic layer is a second bipolar material. The second bipolar material includes at least one of: CBP and NPB, but is not limited thereto. In some embodiments, the second bipolar material includes one component, such as one of CBP and NPB. In some embodiments, the second bipolar material includes two components, such as CBP and NPB. The second bipolar material can ensure the transfer and balance of charges, reduce the accumulation of charges in the light-emitting layer, which is favorable to improving the luminous efficiency of the quantum dot white light-emitting diode and reducing efficiency roll-off, and maintaining the stability of the spectrum, that is critical to white light diodes.

In some embodiments, the first host material in the blue fluorescent organic layer is a mixed material composed of a second n-type semiconductor material and a second p-type semiconductor material, and the second n-type semiconductor material includes at least one of: TPBi, Bepp2, BTPS, and TmPyPb. In some embodiments, the second n-type semiconductor material includes one component, such as one of: TPBi, Bepp2, BTPS, and TmPyPb. In some embodiments, the second n-type semiconductor material includes two components, such as TPBi and Bepp2, Bepp2 and BTPS, or BTPS and TmPyPb. In some embodiments, the second n-type semiconductor material includes three components, such as TPBi, Bepp2 and BTPS, or, Bepp2, BTPS and TmPyPb, or, TPBi, Bepp2 and TmPyPb. In some embodiments, the second n-type semiconductor material includes four components, such as TPBi, Bepp2, BTPS, and TmPyPb. The second p-type semiconductor material includes at least one of: TAPC, mCP, and TCTA. In some embodiments, the second p-type semiconductor material includes one component, such as one of: TAPC, mCP, and TCTA. In some embodiments, the second p-type semiconductor material includes two components, such as TAPC and mCP, TAPC and TCTA, or, mCP and TCTA. In some embodiments, the second p-type semiconductor material includes three components, such as TAPC, mCP and TCTA. T1 refers to the triplet exciton energy of the semiconductor material. For example, the mixed material composed of the second n-type semiconductor material and the second p-type semiconductor material may be one of: TCTA: TPBi, TCTA: TmPyPb, and mCP: TmPyPb, but is not limited thereto. The mixed material composed of the second n-type semiconductor material and the second p-type semiconductor material can also ensure the transfer and balance of charges, reduce the accumulation of charges in the light-emitting layer, which is favorable to improving the luminous efficiency of the quantum dot white light-emitting diode and reducing the efficiency roll-off, and maintaining the stability of the spectrum, that is critical to white light diodes.

In some embodiments, the blue organic fluorescent material includes at least one of: 4P-NPD, Cz-2pbb, POTA, and DADBT, but is not limited thereto. In some embodiments, the blue organic fluorescent material includes a component, such as one of: 4P-NPD, Cz-2pbb, POTA, and DADBT. In some embodiments, the blue organic fluorescent material includes two components, such as 4P-NPD and Cz-2pbb, Cz-2pbb and POTA, POTA and DADBT, or, Cz-2pbb and DADBT. In some embodiments, the blue organic fluorescent material includes three components, such as 4P-NPD, Cz-2pbb and POTA, or, 4P-NPD, Cz-2pbb and DADBT, or, Cz-2pbb, POTA and DADBT. In some embodiments, the blue organic fluorescent material includes four components, such as 4P-NPD, Cz-2pbb, POTA and DADBT. In the blue fluorescent organic layer, the blue organic fluorescent material can capture electron holes to form excitons, and can also receive excitons that transfer from the first host material.

In some embodiments, the blue fluorescent organic layer has a thickness of 10-50 nm.

In some embodiments, the blue fluorescent organic layer may also be a light-emitting layer formed separately from the blue organic fluorescent material. In this embodiment, the thickness of the blue fluorescent organic layer is 5-30 nm.

In some embodiments, when the quantum dot light-emitting layer material includes the quantum dots and the second host material, in order to prevent the quantum dot excitons from being quenched by the second host material, both the singlet exciton energy and the triplet exciton energy of the second host material are greater than the quantum dot exciton energy. In this embodiment, the light-emitting mechanism of the quantum dot light-emitting layer includes three types:

1. Electrons and holes are respectively transmitted from the cathode and the anode to the quantum dot light-emitting layer to generate radiative recombination to emit photons; or
2. Triplet excitons of the blue fluorescent organic layer material diffuse to the quantum dot light-emitting layer and can be transferred to the quantum dots through Dexter energy transfer, and excite the quantum dots to emit photons; or
3. Electrons and holes are transferred from the cathode and anode, respectively, to the second host material to form singlet and triplet excitons, and the singlet and triplet excitons formed in the second host material transfer to the quantum dots by Förster and Dexter energy transfer, respectively, and are radiatively recombined in the quantum dot light-emitting layer to emit photons.

In this embodiment, the second host material is one of: a third bipolar material, a third n-type semiconductor material, a third p-type semiconductor material and the mixed material composed of the third n-type semiconductor material and the third p-type semiconductor material, but is not limited thereto.

In some embodiments, the third bipolar material includes at least one of CBP and NPB, but is not limited thereto. In some embodiments, the third bipolar material includes one component, such as one of CBP and NPB. In some embodiments, the third bipolar material includes two components, such as CBP and NPB.

The third n-type semiconductor material includes at least one of: TPBi, Bepp2, BTPS, and TmPyPb, but is not limited thereto. In some embodiments, the third n-type semiconductor material includes one component, such as one of: TPBi, Bepp2, BTPS, and TmPyPb. In some embodiments, the third n-type semiconductor material includes two components, such as TPBi and Bepp2, Bepp2 and BTPS, or, BTPS and TmPyPb. In some embodiments, the third n-type semiconductor material includes three components, such as TPBi, Bepp2 and BTPS, or, Bepp2, BTPS and TmPyPb, or, TPBi Bepp2 and TmPyPb. In some embodiments, the third n-type semiconductor material includes four components, such as TPBi, Bepp2, BTPS and TmPyPb.

In some embodiments, the third p-type semiconductor material includes at least one of: TAPC, mCP, and TCTA, but is not limited thereto. In some embodiments, the third p-type semiconductor material includes one component, such as one of: TAPC, mCP, and TCTA. In some embodiments, the third p-type semiconductor material includes two components, such as TAPC and mCP, TAPC and TCTA, or, mCP and TCTA. In some embodiments, the third p-type semiconductor material includes three components, such as TAPC, mCP and TCTA.

In some embodiments, the material of the quantum dot light-emitting layer is a quantum dot. In this embodiment, the light-emitting mechanism of the quantum dot light-emitting layer includes two types:

1. Electrons and holes are transferred from the cathode and the anode, respectively, to the quantum dot light-emitting layer to generate radiative recombination to emit photons; or
2. Triplet excitons of the blue fluorescent organic layer material diffuse to the quantum dot light-emitting layer and are transferred to the quantum dots through Dexter energy transfer, and excite the quantum dots to emit photons.

In some embodiments, the blue fluorescent organic layer is disposed near the anode side, and the quantum dot light-emitting layer is disposed near the cathode side. The organic blue fluorescent layer material includes the first host material and the first blue organic fluorescent material doped in the first host material. The quantum dot light-emitting layer material includes quantum dots and a second host material. When the barrier layer material is the first bipolar material or the mixed material composed of the first n-type semiconductor material and the first p-type semiconductor materials, the first host material is selected from one of: the second bipolar material, the second p-type semiconductor material, and a mixed material composed of the second n-type semiconductor material and the second p-type semiconductor material, and the second host material is selected from one of: the third bipolar material, the third n-type semiconductor material, and a mixed material composed of the third n-type semiconductor material and the third p-type semiconductor material.

In some embodiments, when the barrier layer material is the first bipolar material or the mixed material composed of the first n-type semiconductor material and the first p-type semiconductor material, the first host material is the second p-type semiconductor material, and the second host material is the third n-type semiconductor material.

In some embodiments, when the barrier layer material is the first bipolar material or the mixed material composed of the first n-type semiconductor material and the first p-type semiconductor material, the first host material is the mixed material composed of the second n-type semiconductor material and the second p-type semiconductor material, and the second host material is the third n-type semiconductor material. At this time, the first host material can ensure that electrons and holes can be distributed throughout the blue fluorescent organic layer, and sufficient blue light emission can be obtained, which is favorable to reducing the probability of triplet exciton annihilation. On the other hand, the uniformly dispersed triplet excitons are favorable to its diffusion into the quantum dot layer and can ensure the light emission of the quantum dots.

In some embodiments, when the barrier layer material is the first bipolar material or the mixed material composed of the first n-type semiconductor material and the first p-type semiconductor material, the first host material is the second p-type semiconductor material, and the second host material is the mixed material composed of the third n-type semiconductor material and the third p-type semiconductor material. At this time, the second host material is the mixed material composed of the third n-type semiconductor material and the third p-type semiconductor material, and has excellent electron and hole transport capabilities, which can effectively reduce impedance of the quantum dot light-emitting layer such that excitons can be evenly distributed in the quantum dot light-emitting layer, thus reducing the possibility of the exciton annihilation and improving the stability of quantum dot light emission.

In some embodiments, when the barrier layer material is the mixed material composed of the first n-type semiconductor material and the first p-type semiconductor material, and the first host material is the mixed material composed of the second n-type semiconductor material and the second p-type semiconductor material, and the second host material is the mixed material composed of the third n-type semiconductor material and the third p-type semiconductor material. Since the first host material and the second host material have the semiconductor characteristics of the p-type semiconductor material and n-type semiconductor material; that is, they have good electron and hole transport capabilities, which is favorable to reducing the impedance of the entire light-emitting layer, ensures the unimpeded mobilization of the holes transmitted from the anode direction to the quantum dot light-emitting layer. At the same time, it can be ensured that the electrons from the quantum dot light-emitting layer pass through the blue fluorescent organic layer without hindrance, so that charge carriers can be evenly distributed throughout the light-emitting layer, which reduces the probability of exciton annihilation and improves the efficiency and stability of the device.

In some embodiments, when the barrier layer material is the first bipolar material, the first host material is the second bipolar material, and the second host material is the third bipolar material. As implied by their names, the bipolar materials also have excellent electron and hole transport capabilities, which can reduce the impedance of the entire light-emitting layer, such that excitons can be evenly dispersed throughout the light-emitting layer, and the efficiency and stability of the device can improved. Moreover, the use of the bipolar materials is favorable to simplifying the device structure and manufacturing process.

In some embodiments, the blue fluorescent organic layer is disposed near the cathode side, the quantum dot light-emitting layer is disposed near the anode side, and the organic blue fluorescent layer material includes the first host material and the blue organic fluorescent material doped in the first in the host material. The quantum dot light-emitting layer material includes quantum dots and the second host material. When the barrier layer material is the first bipolar material or the mixed material composed of the first n-type semiconductor material and the first p-type semiconductor materials, the first host material is selected from one of: the second bipolar material, the second n-type semiconductor material, and the mixed material composed of the second n-type semiconductor material and the second p-type semiconductor material, and the second host material is selected from one of: the third bipolar material, the third p-type semiconductor material, and the mixed material composed of the third n-type semiconductor material and the third p-type semiconductor material.

In some embodiments, when the barrier layer material is the first bipolar material or the mixed material composed of the first n-type semiconductor material and the first p-type semiconductor material, the first host material is the second n-type semiconductor material, and the second host material is the third p-type semiconductor material.

In some embodiments, when the barrier layer material is the first bipolar material or the mixed material composed of the first n-type semiconductor material and the first p-type semiconductor material, the first host material is the mixed material composed of the second n-type semiconductor materials and the second p-type semiconductor material, and the second host material is the third p-type semiconductor material. At this time, the first host material is the mixed material composed of the second n-type semiconductor material and the second p-type semiconductor material, which can ensure the distribution of electrons and holes in the entire blue fluorescent organic layer and that sufficient blue light emission can be obtained, and is favorable to reducing the probability of triplet exciton annihilation. On the other hand, the uniformly dispersed triplet excitons are favorable to their diffusion into the quantum dot layer, which ensures the light emission of the quantum dots.

In some embodiments, when the barrier layer material is the first bipolar material or the mixed material composed of the first n-type semiconductor material and the first p-type semiconductor material, the first host material is the second n-type semiconductor material, and the second host material is the mixed material composed of the third n-type semiconductor material and the third p-type semiconductor material. At this time, the second host material is the mixed material composed of the third n-type semiconductor material and the third p-type semiconductor material, which has both excellent electron and hole transport capabilities and can effectively reduce the impedance of the quantum dot light-emitting layer, so that the excitons can be evenly distributed in the quantum dot light-emitting layer, thus reducing the possibility of excitons annihilation and improving the stability of quantum dot light emission.

In some embodiments, when the barrier layer material is the mixed material composed of the first n-type semiconductor material and the first p-type semiconductor material, the first host material is the mixed material composed of the second n-type semiconductor material and the second p-type semiconductor material, and the second host material is the mixed material composed of the third n-type semiconductor material and the third p-type semiconductor material. Since the first host material and the second host material have the semiconductor characteristics of the p-type semiconductor material and n-type semiconductor material; that is, they have good electron and hole transport capabilities, which is favorable to reducing the impedance of the entire light-emitting layer, and can ensure the unimpeded mobilization of the holes transmitted from the anode direction to the blue fluorescent organic layer, and can ensure that at the same time the electrons from the organic fluorescent layer pass through the quantum dot light-emitting layer without hindrance, so that charge carriers can be evenly distributed throughout the light-emitting layer, thus reducing the probability of exciton annihilation and improving the efficiency and stability of the device.

In some embodiments, when the barrier layer material is the first bipolar material, the first host material is the second bipolar material, and the second host material is the third bipolar material. Bipolar materials have excellent electron and hole transport capabilities, which can reduce the impedance of the entire light-emitting layer, make excitons uniformly dispersed throughout the light-emitting layer, and improve the efficiency and stability of the device. Moreover, the use of bipolar materials is favorable to simplifying the device structure and manufacturing process.

In some embodiments, to prevent the triplet exciton energy of the blue organic fluorescent material from being quenched, the triplet exciton energy of the blue organic fluorescent material should be greater than the energy of the quantum dot in the quantum dot light-emitting layer. Therefore, in the light-emitting layer, the selection of the quantum dots can be different according to the difference in the triplet exciton energy of the blue organic fluorescent materials. When the triplet exciton energy of the blue organic fluorescent material is greater than 2.38 eV, the quantum dots are yellow quantum dots; or, the quantum dots are mixed quantum dots composed of red quantum dots and green quantum dots; or, the quantum dots are mixed quantum dots including red quantum dots, yellow quantum dots and green quantum dots, and a half-wave width of the luminescent spectrum of the yellow quantum dots is greater than 70 nm. For example, when the blue organic fluorescent material is one of Cz-2pbb (T1=2.46 eV) or POTA (T1=2.44 eV), the yellow quantum dots includes at least one of: CuInS/ZnS, ZnCuInS/ZnS, AgInS/ZnS, and InP/ZnS, but not limited to this. The red and green quantum dots can be independently selected from at least one of: CdSe/ZnS, CdSe/CdS, CdSe/CdS/ZnS, CuInS/ZnS, ZnCuInS/ZnS, AgInS/ZnS and InP/ZnS, but not limited thereto. In some embodiments, the yellow quantum dots include one component such as one of: CuInS/ZnS, ZnCuInS/ZnS, AgInS/ZnS, and InP/ZnS. In some embodiments, the yellow quantum dots include two components, such as CuInS/ZnS and ZnCuInS/ZnS, ZnCuInS/ZnS and AgInS/ZnS, or AgInS/ZnS and InP/ZnS. In some embodiments, the yellow quantum dots include three components, such as CuInS/ZnS, ZnCuInS/ZnS and AgInS/ZnS, or, ZnCuInS/ZnS, AgInS/ZnS and InP/ZnS, or, CuInS/ZnS, ZnCuInS/ZnS and InP/ZnS. In some embodiments, the yellow quantum dots include four components, such as CuInS/ZnS, ZnCuInS/ZnS, AgInS/ZnS and InP/ZnS.

In some embodiments, the red quantum dots or green quantum dots include one component, such as one of: CdSe/ZnS, CdSe/CdS, CdSe/CdS/ZnS, CuInS/ZnS, ZnCuInS/ZnS, AgInS/ZnS, and InP/ZnS. In some embodiments, the red or green quantum dots include two components, such as CdSe/ZnS and CdSe/CdS, CdSe/CdS/ZnS and CuInS/ZnS, ZnCuInS/ZnS and AgInS/ZnS, or, AgInS/ZnS and InP/ZnS. In some embodiments, the red quantum dots or green quantum dots include three components, such as CdSe/ZnS, CdSe/CdS and CdSe/CdS/ZnS, or, CdSe/CdS, CdSe/CdS/ZnS and CuInS/ZnS, or, CuInS/ZnS, ZnCuInS/ZnS and AgInS/ZnS. In some embodiments, the red quantum dots or the green quantum dots include four components, such as CdSe/ZnS, CdSe/CdS, CdSe/CdS/ZnS and CuInS/ZnS, or, CuInS/ZnS, ZnCuInS/ZnS, AgInS/ZnS and InP/ZnS.

In some embodiments, when the triplet exciton energy of the blue organic fluorescent material is greater than 2.38 eV, the quantum dot light-emitting layer is stacked by a red quantum dot film layer and a green quantum dot film layer. A thickness of the red quantum dot film layer and a thickness of the green quantum dot film layer are each 5-15 nm.

In some embodiments, when the triplet exciton energy of the blue fluorescent organic layer material is greater than 2.38 eV, the quantum dot light-emitting layer is a single mixed film layer formed by mixing the red quantum dots and green quantum dots. A thickness of the mixed film layer is 10-30 nm.

In some embodiments, when the triplet exciton energy of the blue fluorescent organic layer material is greater than 2.38 eV, the quantum dots are yellow quantum dots, and a thickness of the quantum dot light-emitting layer is 5-50 nm.

In some embodiments, when the triplet exciton energy of the blue fluorescent organic layer material is greater than 2.38 eV, the quantum dots are mixed quantum dots including red quantum dots, yellow quantum dots, and green quantum dots, and the thickness of the quantum dot light-emitting layer is 15-50 nm.

In some embodiments, when the triplet exciton energy of the blue fluorescent organic layer material is greater than 2.38 eV, the quantum dot light-emitting layer is stacked by the red quantum dot film layer, the yellow quantum dot film layer and the green quantum dot film layer The thickness of the red quantum dot film layer, the yellow quantum dot film layer and the green quantum dot film layer are each 5-15 nm.

In some embodiments, when the triplet exciton energy of the blue fluorescent organic layer material is 2.25 eV-2.38 eV, the quantum dots are yellow quantum dots, or the quantum dots are mixed quantum dots composed of red quantum dots and yellow quantum dots. The half-wave width of the luminescent spectrum of the yellow quantum dots is greater than 70 nm, and a half-wave width of the luminescent spectrum of the red quantum dots is not limited. When the quantum dots are yellow quantum dots, the thickness of the quantum dot light-emitting layer is 5-50 nm. When the quantum dots are a single mixed film formed by mixing the red quantum dots and yellow quantum dots, the thickness of the single mixed film layer is 10-50 nm. When the quantum dot light-emitting layer is stacked by the red quantum dot film layer and the yellow quantum dot film layer, the thickness of the red quantum dot film layer and the yellow quantum dot film layer are each 5-15 nm.

For example, when the blue fluorescent organic layer material is 4P-NPD (T1=2.3 eV) or DADBT (T1=2.38 eV), the red quantum dots include at least one of: CdSe/ZnS, CdSe/CdS, CdSe/CdS/ZnS, CuInS/ZnS, ZnCuInS/ZnS, AgInS/ZnS and InP/ZnS, but is not limited to this. The yellow quantum dots include at least one of: CuInS/ZnS, ZnCuInS/ZnS, AgInS/ZnS, and InP/ZnS, but is not limited thereto.

In some embodiments, the substrate may be a rigid material substrate, such as glass, or a flexible material substrate, such as PET or PI.

In some embodiments, the anode may be selected from one or more of: indium-doped tin oxide (ITO), fluorine-doped tin oxide (FTO), antimony-doped tin oxide (ATO), aluminum-doped zinc oxide (AZO), etc. In some embodiments, the material of the hole transport layer may be selected from materials with good hole transport properties, such as one of more of: p-type TAPC, mCP, TFB, PVK, Poly-TPD, PFB, TCTA, CBP, TPD, NPB, but not limited hereto.

In some embodiments, the material of the electron transport layer may be selected from materials with good electron transport properties, such as one or more of: n-type TPBi, Bepp2, BTPS, TmPyPb, ZnO, $TiO_2$, $Fe_2O_3$, $SnO_2$, $Ta_2O_3$, AlZnO, ZnSnO, InSnO, but is not limited hereto.

In some embodiments, the cathode may be selected from one of: aluminum (Al) electrodes, silver (Ag) electrodes, and gold (Au) electrodes.

It should be noted that the quantum dot white light-emitting diode of the present disclosure may further include one or more layers of the following functional layers: a hole injection layer disposed between the anode and the hole transport layer, and an electron injection layer disposed between the cathode and the electron transport layer.

The present disclosure also provides an embodiment of a method for manufacturing a quantum dot white light-emitting diode with a regular structure, as shown in FIG. 1, which specifically includes the following steps: providing a substrate, forming an anode on the substrate; preparing a hole transport layer on the anode; preparing a blue fluorescent organic layer on the hole transport layer; preparing a spacer layer on the blue fluorescent organic layer; preparing a quantum dot light-emitting layer on the spacer layer; preparing an electron transport layer on the quantum dot light-emitting layer; and preparing a cathode on the electron transport layer to obtain the quantum dot white light-emitting diode. The spacer material is a material having both electron and hole transport capabilities, the triplet exciton energy of the spacer material is greater than the triplet exciton energy of the blue organic fluorescent material in the blue fluorescent organic layer, and the triplet exciton energy of the spacer material is greater than the exciton energy of quantum dots in the quantum dot light-emitting layer.

In the present disclosure, each layer preparation method may be a chemical method or a physical method. The chemical method includes but is not limited to one or more of: chemical vapor deposition method, continuous ion layer adsorption and reaction method, anode oxidation method, electrolytic deposition method, and co-precipitation method. The physical method include but is not limited to one or more of: solution method (e.g., spin coating method, printing method, knife coating method, dipping and pulling method, soaking method, spraying method, roll coating method, casting method, slot die coating method, or strip coating method, etc.), evaporation method (e.g., thermal evaporation method, electron beam evaporation method, magnetron sputtering method or multi-arc ion coating method, etc.), and deposition method (e.g., physical vapor deposition method, atomic layer deposition method, pulsed laser deposition method, etc.).

Figure 2:
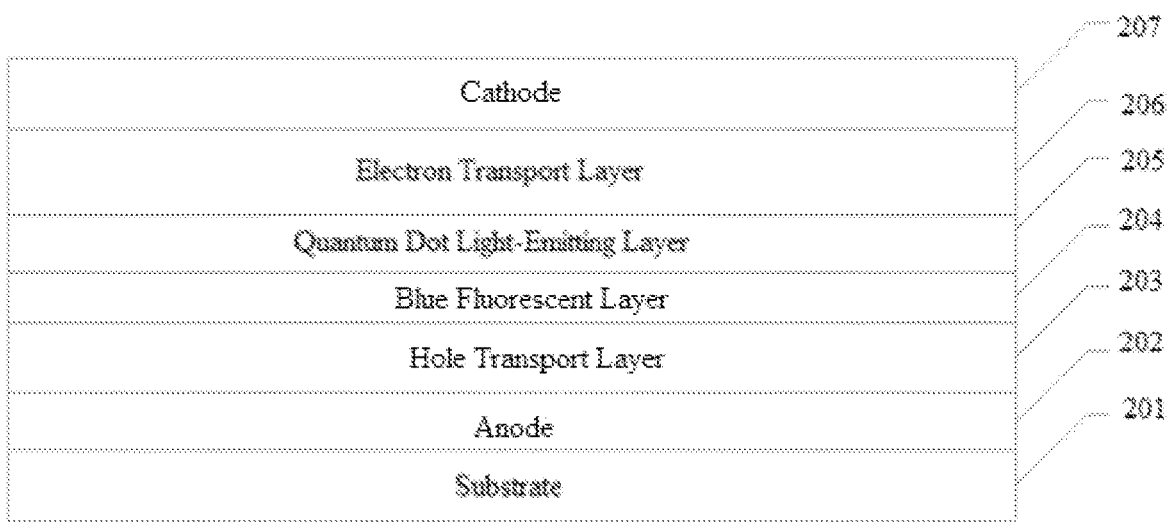
FIG. 2 is a schematic structural diagram of another quantum dot white light-emitting diode according to an embodiment of the present disclosure.

In some embodiments, a quantum dot white light-emitting diode with a regular structure is also provided, as shown in FIG. 2, including: a substrate 201, an anode 202, a hole transport layer 203, a blue fluorescent organic layer 204, a quantum dot light-emitting layer 205, an electron transport layer 206, and a cathode 207 stacked from bottom to top. The blue fluorescent organic layer material includes a first host material formed by mixing the first p-type semiconductor material and the first n-type semiconductor material, and a blue organic fluorescent material doped in the first host material. The singlet exciton energy of the first host material is greater than the singlet exciton energy of the blue organic fluorescent material, and the triplet exciton energy of the first host material is greater than the triplet exciton energy of the blue organic fluorescent material.

The blue fluorescent organic layer material in this embodiment includes a first host material formed by mixing the first p-type semiconductor material and the first n-type semiconductor material, and a blue organic fluorescent material doped in the first host material. The blue fluorescent organic layer composed of this material can effectively improve the luminous efficiency of the quantum dot white light-emitting diode. The mechanism for achieving the above effects is as follows:

1. Since the blue organic fluorescent material in the blue fluorescent organic layer is doped in the first host material, the singlet and triplet excitons of the blue organic fluorescent material can also be distributed in the first host material, which is favorable to reducing the effect of exciton annihilation, and ensures that the quantum dot white light-emitting diode can emit white light stably under the condition of large current density or high brightness.

2. The singlet exciton energy of the first host material is greater than the singlet exciton energy of the blue organic fluorescent material, and the triplet exciton energy of the first host material is greater than the triplet exciton energy of the blue organic fluorescent material, so that the singlet excitons formed in the first host material can transfer to the blue organic fluorescent material through Förster energy transfer, and be radiatively recombined in the blue organic fluorescent material to emit blue light. At the same time, the triplet excitons of the first host material and the blue organic fluorescent material can diffuse to the quantum dot light-emitting layer and transfer the triplet exciton energy to the quantum dots through the Dexter energy transfer method, and excite the quantum dots to emit photons, thereby enhancing the luminous efficiency of the quantum dot white light-emitting-emitting diode.

It should be noted that the quantum dot white light-emitting diode with a regular structure may further include a substrate, an anode, a hole transport layer, a quantum dot light-emitting layer, a blue fluorescent organic layer, an electron transport layer, and a cathode that are stacked from bottom to top. The blue fluorescent organic layer material includes a first host material formed by mixing the first p-type semiconductor material and the first n-type semiconductor material and, a blue organic fluorescent material doped in the first host material. The singlet exciton energy of the first host material is greater than the singlet exciton energy of the blue organic fluorescent material, and the triplet exciton energy of the first host material is greater than the triplet exciton energy of the blue organic fluorescent material. The quantum dot white light-emitting diode having this structure can also improve its luminous efficiency, and the mechanism for achieving the above effect is the same as the above embodiment. In some embodiments, in the blue fluorescent organic layer, the doping concentration of the blue organic fluorescent material is 0.5-3%. Due to the extremely short life span of the singlet excitons, the exciton diffusion length is less than 1 nm. The singlet excitons generally transfer the energy of excitons through Förster energy transfer, and the effective radius of action is usually between 3-5 nm; while the triplet exciton diffusion length can reach 100 nm thanks to its long life span. The triplet excitons generally transfer exciton energy through Dexter energy transfer, and its effective radius of action is within 1 nm. In this embodiment, the doping concentration of the blue organic fluorescent material is set to 0.5-3%, so that the proportion of singlet excitons near the light-emitting layer of quantum dots of the blue fluorescent organic layer in the range of 3-5 nm can be significantly reduced, thereby effectively reducing the probability of the singlet excitons of the blue organic fluorescent material transferring to the quantum dot light-emitting layer, so that the singlet excitons of the blue organic fluorescent material can be recombined in the blue fluorescent organic layer to emit blue light.

Since the effective radius of Dexter energy transfer is within 1 nm, under the condition that the doping concentration of the blue organic fluorescent material is 0.5-3%, the triplet excitons of the first host material cannot find the blue organic fluorescent material that transfers energy within the range of 1 nm. Accordingly, in this embodiment, the first host material can be effectively prevented from transferring triplet excitons to the blue organic fluorescent material and returning to the ground state in a non-radiative recombination manner that results in energy loss.

In some embodiments, the thickness of the blue fluorescent organic layer is 10-40 nm, and within this thickness range, both the first host material and the triplet excitons of the blue organic fluorescent material in the blue fluorescent organic layer can diffuse to the quantum dot light-emitting layer and transfer the triplet exciton energy to the quantum dot through the Dexter energy transfer method, exciting the quantum dot to emit photons.

In some embodiments, the first host material in the blue fluorescent organic layer is a mixed material composed of the first p-type semiconductor material with hole transport capability and the first n-type semiconductor material with electron transport capability. In other words, the first host material has both electron and hole transport capabilities.

Therefore, the first host material can also ensure the transfer and balance of charge, reduce the accumulation of charge in the light-emitting layer, which is favorable to improving the luminous efficiency of the quantum dot white light-emitting diode and reducing the efficiency roll-off, and maintaining the stability of the spectrum, that is critical for white light diodes.

In some embodiments, when an electron transport layer is disposed between the cathode and the light-emitting layer, and the blue fluorescent organic layer is disposed near one side of the electron transport layer, the material of the electron transport layer is the same as at least one of the first n-type semiconductor materials in the blue fluorescent organic layer material. Since the material in the electron transport layer is the same as at least one of the first n-type semiconductor materials in the blue fluorescent organic layer material, no interface barrier exits when the electrons output from the electron transport layer are transmitted to the blue light organic fluorescent layer, and the electrons can be quickly and unimpededly transported from the electron transport layer to the blue fluorescent organic layer, thereby improving the exciton recombination efficiency.

In some embodiments, when a hole transport layer is disposed between the anode and the light-emitting layer, and the blue fluorescent organic layer is disposed near one side of the hole transport layer, the material of the hole transport layer is the same as at least one of the first p-type semiconductor materials in the blue fluorescent organic layer material. Since the material in the hole transport layer is the same as at least one of the first p-type semiconductor materials in the blue fluorescent organic layer material, no interface barrier exits when the holes output from the hole transport layer are transported to the blue fluorescent organic layer, and the holes can be quickly and unimpededly transported from the electron transport layer to the blue fluorescent organic layer, thereby improving the exciton recombination efficiency.

In some embodiments, the quantum dot light-emitting layer material includes the quantum dot and the second host material. In order to prevent the quantum dot excitons from being quenched by the second host material, the singlet exciton energy and triplet exciton energy of the second host material are both greater than the quantum dot exciton energy. In this embodiment, the light-emitting mechanism of the quantum dot light-emitting layer includes three types:

1. Electrons and holes are transferred from the cathode and the anode, respectively, to the quantum dot light-emitting layer to generate radiative recombination to emit photons;

2. Triplet excitons of the blue fluorescent organic layer material diffuse to the quantum dot light-emitting layer and can be transferred to the quantum dots by Dexter energy transfer, and excite the quantum dots to emit photons;

3. The electrons and holes are respectively transferred from the cathode and the anode to the second host material singlet and triplet excitons are formed in, the singlet and triplet excitons formed in the second host material are transferred to the quantum dots by Förster and Dexter energy transfer, respectively, and are recombined radiatively in the quantum dot light-emitting layer to emit photons.

In this embodiment, the second host material is one of: the first bipolar material, the second n-type semiconductor material, the second p-type semiconductor material and the mixed material composed of the second n-type semiconductor material and the second p-type semiconductor material, but is not limited hereto. In some embodiments, the first bipolar material includes at least one of CBP and NPB, but is not limited hereto; the second n-type semiconductor material includes at least one of: TPBi, Bepp2, BTPS, and TmPyPb, but is not limited hereto; and the second p-type semiconductor material includes at least one of: TAPC, mCP, and TCTA, but is not limited hereto.

In some embodiments, the material of the quantum dot light-emitting layer is a quantum dot. In this embodiment, the light-emitting mechanism of the quantum dot light-emitting layer includes two types:

1. Electrons and holes are respectively transferred from the cathode and the anode to the quantum dot light-emitting layer and radiatively recombined to emit photons;

2. The triplet excitons of the blue fluorescent organic layer material diffuse to the quantum dot light-emitting layer and are transferred to the quantum dots through Dexter energy transfer, and excite the quantum dots to emit photons.

In some embodiments, the blue fluorescent organic layer is disposed near the anode side, and the quantum dot light-emitting layer is disposed near the cathode side. The material of the quantum dot light-emitting layer includes quantum dots and a second host material, and the second host material is selected from one of: the first bipolar material, the second n-type semiconductor material, the second p-type semiconductor material, and the mixed material composed of the second n-type semiconductor material and the second p-type semiconductor material.

In some embodiments, the second host material is the mixed material composed of the second n-type semiconductor material and the second p-type semiconductor material. The mixed material composed of the second n-type semiconductor material and the second p-type semiconductor material has good electron and hole transport capabilities, which is favorable to reducing the impedance of the light-emitting layer, and ensures that the electrons transmitted from the cathode direction can move toward the blue fluorescent organic layer without hindrance and that the holes from the movement of the blue fluorescent organic layer can pass through the quantum dot light-emitting layer without hindrance, so that charge carriers can be evenly distributed throughout the light-emitting layer, thus reducing the probability of exciton annihilation and improving the efficiency and stability of the device.

In some embodiments, the second host material is the first bipolar material. The first bipolar material also has excellent electron and hole transport capabilities, and can play the same role as the above described second n-type semiconductor and second p-type semiconductor mixed material.

In some embodiments, the blue fluorescent organic layer is disposed near the cathode side, and the quantum dot light-emitting layer is disposed near the anode side. The quantum dot light-emitting layer material includes quantum dots and a second host material, and the second host material is selected from one of: the first bipolar material, the second n-type semiconductor material, the second p-type semiconductor material, and the mixed material composed of the second n-type semiconductor material and the second p-type semiconductor material.

In some embodiments, the second host material is the mixed material composed of the second n-type semiconductor material and the second p-type semiconductor material. The mixed material composed of the second n-type semiconductor material and the second p-type semiconductor material has good electron and hole migration capabilities, which is favorable to reducing the impedance of the light-emitting layer, and ensures that the electrons transmitted in the cathode direction can move toward the blue fluorescent organic layer without hindrance and that the holes moved from the blue fluorescent organic layer can pass through the quantum dot light-emitting layer without hindrance, so that charge carriers can be evenly distributed throughout the light-emitting layer, thus reducing the probability of the exciton annihilation and improving the efficiency and stability of the device.

In some embodiments, the second host material is the first bipolar material. Likewise, the first bipolar material also has excellent electron and hole transport capabilities, and can play the same role as the above-mentioned second n-type semiconductor and second p-type semiconductor mixed material.

In some embodiments, the present disclosure also provides an example of a method for manufacturing a quantum dot white light-emitting diode with a regular structure as shown in FIG. 2, specifically including the following steps: providing a substrate, forming an anode on the substrate; preparing a hole transport layer on the anode; preparing a blue fluorescent organic layer on the hole transport layer; preparing a spacer layer on the blue fluorescent organic layer; preparing the quantum dot light-emitting layer on the spacer layer; preparing an electron transport layer on the quantum dot light-emitting layer; and preparing a cathode on the electron transport layer to obtain the quantum dot white light-emitting diode. The spacer material is a material having both electron and hole transport capabilities, the triplet exciton energy of the spacer material is greater than the triplet exciton energy of the blue organic fluorescent material in the blue fluorescent organic layer, and the triplet exciton energy of the spacer material is greater than the exciton energy of quantum dots in the quantum dot light-emitting layer.

The disclosure will be illustrated in detail below by embodiments.

Embodiment One

Figure 3:
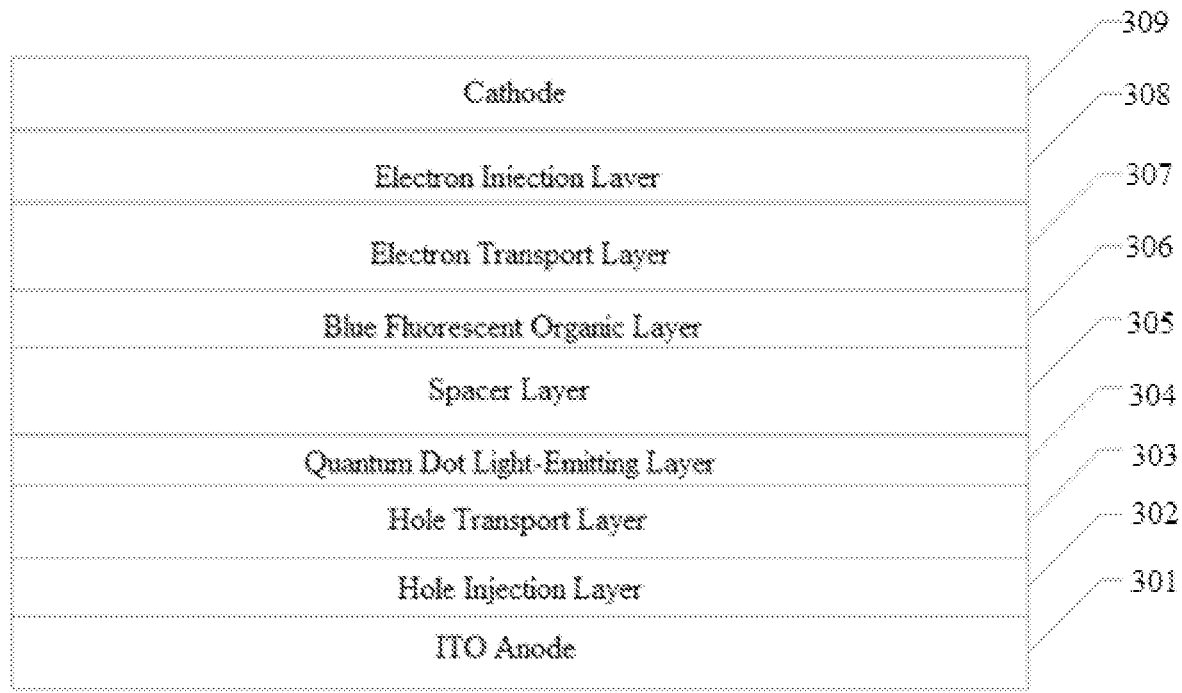
FIG. 3 is a schematic structural diagram of the quantum dot white light-emitting diode according to Embodiment One of the present disclosure.

For example, as shown in FIG. 3, TCTA: TmPyPb mixed material is used as the spacer material. The quantum dot white light-emitting diodes include: an ITO anode 301, a hole injection layer 302, a hole transport layer 303, a quantum dot light-emitting layer 304, a spacer layer 305, a blue fluorescent organic layer 306, an electron transport layer 307, an electron injection layer 308 and a cathode 309. The specific preparation includes the following steps: depositing PEDOT: PSS by solution method on a patterned ITO glass as a hole injection layer having a thickness of 30 nm; depositing TFB by solution method on the PEDOT: PSS as a hole transport layer having a thickness of 30 nm; depositing mixed red and green quantum dots by solution method on the TFB as a quantum dot light-emitting layer having a thickness of 15 nm; depositing TCTA: TmPyPb mixed material by co-evaporation method on the quantum dot light-emitting layer as a spacer layer having a thickness of 8 nm; depositing POTA and TCTA: TmPyPb by co-evaporation method on the spacer layer as a blue fluorescent organic layer having a thickness of 15 nm; depositing TmPyPb by vapor deposition on the blue fluorescent organic layer as an electron transport layer having a thickness of 30 nm; depositing LiF on the TmPyPb by vapor deposition as an electron injection layer having a thickness of 1 nm; and depositing Al by vapor deposition on the LiF as a cathode having a thickness of 100 nm.

Embodiment Two

In an embodiment, CBP is used as the spacer material, quantum dot white light-emitting diodes include: a ITO anode, a hole injection layer, a hole transport layer, a quantum dot light-emitting layer, a spacer layer, a blue fluorescent organic layer, an electron transport layer, an electron injection layer, and a cathode. The specific preparation includes the following steps: depositing PEDOT: PSS by solution method on a patterned ITO glass as a hole injection layer having a thickness of 30 nm; depositing TFB by solution method on the PEDOT: PSS as a hole transport layer having a thickness of 30 nm; depositing the CBP: red and green quantum dot mixed material by solution method on the TFB as the quantum dot light-emitting layer having a thickness of 20 nm; depositing CBP by vapor deposition on the quantum dot light-emitting layer as the spacer layer having a thickness of 8 nm; depositing POTA and CBP by vapor deposition on the spacer layer as a blue fluorescent organic layer having a thickness of 15 nm; depositing TmPyPb by vapor deposition on the blue fluorescent organic layer as an electron transport layer having a thickness of 30 nm; depositing LiF by vapor deposition on the TmPyPb as an electron injection layer having a thickness of 1 nm; and depositing Al by vapor deposition on LiF as a cathode with a thickness of 100 nm.

Embodiment Three

Figure 4:
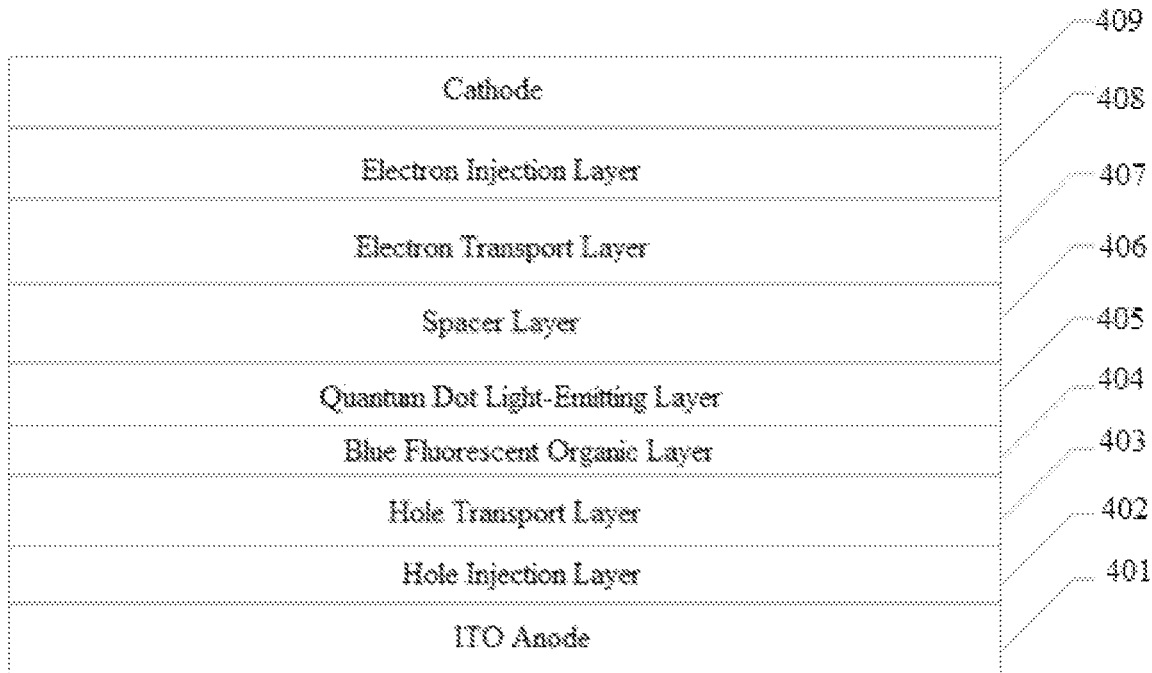
FIG. 4 is a schematic structural diagram of the quantum dot white light-emitting diode according to Embodiment Three of the present disclosure.

In an embodiment, TCTA: TPBi mixed material is used as the spacer material. As shown in FIG. 4, the quantum dot white light-emitting-emitting diode include sequentially from bottom to top: a ITO anode 401, a hole injection layer 402, a hole transport layer 403, a blue fluorescent organic layer 404, a quantum dot light-emitting layer 405, a spacer layer 406, an electron transport layer 407, an electron injection layer 408 and a cathode 409. The specific preparation includes the following steps: depositing PEDOT: PSS on a patterned ITO glass as a hole injection layer having a thickness of 30 nm; depositing TFB by solution method on the PEDOT: PSS as a hole transport layer having a thickness of 30 nm; depositing POTA and TCTA: TmPyPb by co-evaporation method on the TFB as a blue fluorescent organic layer having a thickness of 15 nm; depositing sequentially stacked red and green quantum dot films by solution method on the blue fluorescent organic layer as a quantum dot light-emitting layer, a thickness of the red quantum dot film being 5 nm, and a thickness of the green quantum dot film being 10 nm; depositing TCTA: TPBi mixed material by co-evaporation method on the quantum dot luminescent layer as a spacer layer with a thickness of 8 nm; depositing TmPyPb by vapor deposition on the spacer layer as an electron transport layer having a thickness of 30 nm; depositing LiF by vapor deposition on TmPyPb as an electron injection layer having a thickness of 1 nm; and depositing Al by vapor deposition on LiF as a cathode having a thickness of 100 nm.

Embodiment Four

In an embodiment, NPB is used as the spacer material. The quantum dot white light-emitting diode includes: an ITO anode, a hole injection layer, a hole transport layer, a blue fluorescent organic layer, a quantum dot light-emitting layer, a spacer layer, an electron transport layer, an electron injection layer, and a cathode. The specific preparation includes the following steps: depositing PEDOT: PSS by solution method on the patterned ITO glass as a hole injection layer having a thickness of 30 nm; depositing TFB by solution method on PEDOT: PSS as a hole transport layer having a thickness of 30 nm; depositing Cz-2pbb by vapor deposition as a blue fluorescent organic layer on TFB having a thickness of 15 nm; depositing sequentially stacked red and green quantum dot films by solution method on the blue fluorescent organic layer as a quantum dot light-emitting layer, a thickness of the red quantum dot film being 5 nm, and a thickness of the green quantum dot film being 10 nm; depositing NPB by vapor deposition on the quantum dot light-emitting layer as a spacer layer having a thickness of 8 nm; depositing TmPyPb by vapor deposition on the spacer layer as an electron transport layer having a thickness of 30 nm; depositing LiF by vapor deposition on TmPyPb as an electron injection layer having a thickness of 1 nm; and depositing Al by vapor deposition on LiF as a cathode having a thickness of 100 nm.

Embodiment Five

Figure 5:
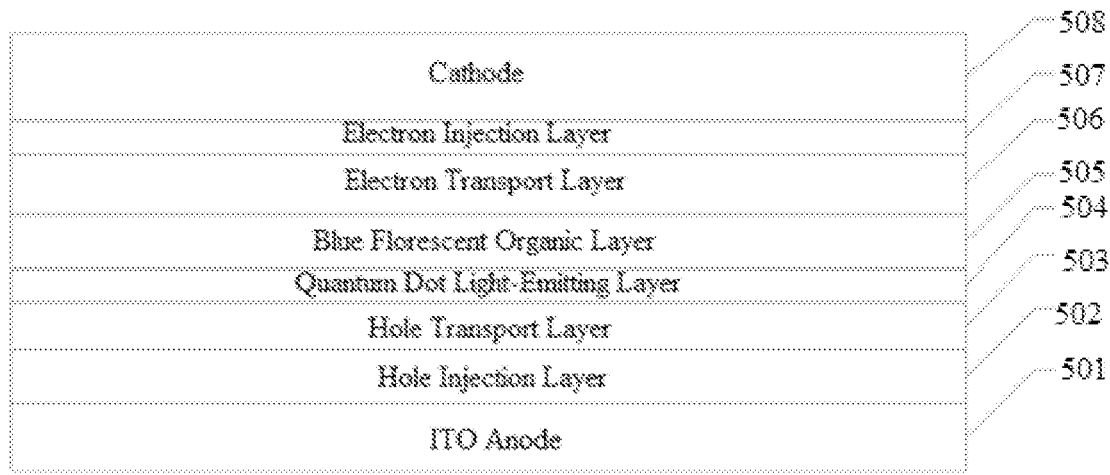
FIG. 5 is a schematic structural diagram of the quantum dot white light-emitting diode according to Embodiment Five of the present disclosure.

As shown in FIG. 5, a quantum dot white light-emitting diode includes sequentially from bottom to top: an ITO anode 501, a hole injection layer 502, a hole transport layer 503, a quantum dot light-emitting layer 504, a blue fluorescent organic layer 505, an electron transport layer 506, an electron injection layer 507, and a cathode 508. The blue fluorescent organic layer material includes a TCTA: TmPyPb host material with a weight ratio of 1:1, and an organic fluorescent material POTA doped in the host material, a doping concentration of the POTA being 2%. The preparation method of the quantum dot white light-emitting-emitting diode includes the following steps: depositing PEDOT: PSS by solution method on a patterned ITO glass as a hole injection layer having a thickness of 30 nm; depositing TFB by solution method on PEDOT: PSS as a hole transport layer having a thickness of 30 nm; depositing mixed red and green quantum dots by solution method on TFB as a quantum dot light-emitting layer having a thickness of 15 nm; depositing POTA (2%)-doped TCTA: TmPyPb (1:1) by vapor deposition on the quantum dot light-emitting layer as a blue fluorescent organic layer having a thickness of 25 nm; depositing TmPyPb by vapor deposition on the blue fluorescent organic layer as an electron transport layer having a thickness of 30 nm; depositing LiF by vapor deposition on the TmPyPb as an electron injection layer having a thickness of 1 nm; and depositing Al by vapor deposition on the LiF as a cathode having a thickness is 100 nm.

Embodiment Six

Figure 6:
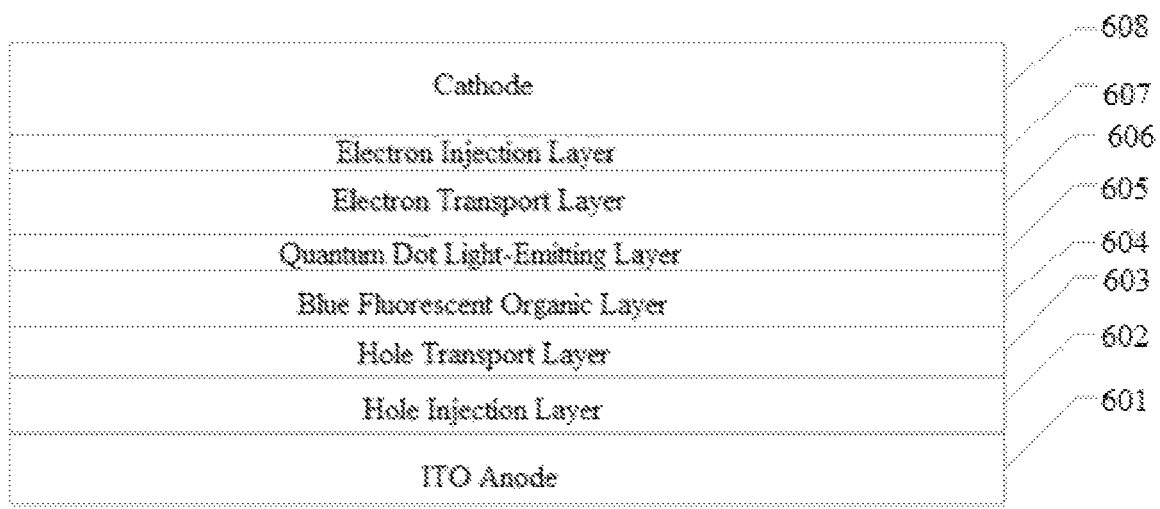
FIG. 6 is a schematic structural diagram of the quantum dot white light-emitting diode according to Embodiment Six of the present disclosure.

As shown in FIG. 6, a quantum dot white light-emitting diode includes sequentially from bottom to top: an ITO anode 601, a hole injection layer 602, a hole transport layer 603, a blue fluorescent organic layer 604, a quantum dot light-emitting layer 605, and an electron transport layer 606, an electron injection layer 607 and a cathode 608. The blue fluorescent organic layer material includes a TCTA: TPBi host material with a weight ratio of 1:1, and an organic fluorescent material 4P-NPD doped in the host material. A doping concentration of 4P-NPD is 1%. The preparation method of the quantum dot white light-emitting diode includes the following steps: depositing PEDOT: PSS by solution method on a patterned ITO glass as a hole injection layer having a thickness of 30 nm; depositing TCTA by solution method on PEDOT: PSS as a hole transport layer having a thickness of 30 nm; depositing 4P-NPD (1%)-doped TCTA: TPBi (1:1) by co-evaporation on the TFB as a blue fluorescent organic layer having a thickness of 25 nm; depositing CBP: red and green quantum dot mixture by solution method on a blue fluorescent organic layer as a quantum dot light-emitting layer having a thickness of 20 nm; depositing TmPyPb by vapor deposition on the quantum dot light-emitting layer as an electron transport layer having a thickness of 30 nm by evaporation; depositing LiF by vapor deposition on TmPyPb as an electron injection layer having a thickness of 1 nm; and depositing Al by vapor deposition on LiF as a cathode having a thickness of 100 nm.

Embodiment Seven

In an embodiment, a quantum dot white light-emitting diode includes sequentially from bottom to top: an ITO anode, a hole injection layer, a hole transport layer, a blue fluorescent organic layer, a quantum dot light-emitting layer, an electron transport layer, an electron injection layer, and a cathode. The blue organic fluorescent layer material includes an mCP: TmPyPb host material with a weight ratio of 1:1, and an organic fluorescent material DADBT doped in the host material. A doping concentration of the DADBT is 3%. The preparation method of the quantum dot white light-emitting diode includes the following steps: depositing PEDOT: PSS by solution method on a patterned ITO glass as a hole injection layer having a thickness of 30 nm; depositing TFB by solution method on PEDOT: PSS as a hole transport layer having a thickness of 30 nm; depositing sequentially a red quantum dot film and a green quantum dot film by solution method on TFB as a quantum dot light-emitting layer, a thickness of the red quantum dot film being 5 nm, and a thickness of the green quantum dot film being 10 nm; depositing DADBT (3%)-doped mCP: TmPyPb (1:1) by co-evaporation on the quantum dot light-emitting layer as a blue fluorescent organic layer having a thickness of 25 nm; depositing TmPyPb by vapor deposition on the quantum dot light-emitting layer as an electron transport layer having a thickness of 30 nm; depositing LiF by vapor deposition on TmPyPb as an electron injection layer having a thickness of 1 nm; and depositing Al by vapor deposition on LiF as a cathode by vapor deposition having a thickness of 100 nm. In summary, the present disclosure provides a quantum dot white light-emitting diode by disposing a spacer layer with electron and hole transport capabilities between a blue fluorescent organic layer and the quantum dot light-emitting layer. The spacer layer can prevent singlet excitons from being transferred to the blue fluorescent organic layer material, so that the singlet excitons can be completely used to generate blue light. Also in the spacer layer, the triplet excitons of the blue organic light-emitting layer can diffuse to quantum dots of the light-emitting layer and photosensitize the quantum dots to emit light, thereby effectively improving the luminous efficiency of the quantum dot white light-emitting diode. The present disclosure also provides a quantum dot white light-emitting diode by uniformly doping a blue organic fluorescent material in a first host material formed by mixing a first p-type semiconductor material and a first n-type semiconductor material. The singlet excitons in the first host material can be transferred to the blue organic fluorescent material through Förster energy transfer and are radiatively recombined to emit blue light. The triplet excitons of the first host material and the blue organic fluorescent material can diffuse to the quantum dot light-emitting layer and are transferred to the quantum dots through Dexter energy transfer, and excite the quantum dots to emit photons, thereby effectively improving the luminous efficiency of the quantum dot white light-emitting diodes.

It should be understood that the application of the present disclosure is not limited to the above examples. For those of ordinary skill in the art, improvements or variations can be made according to the above description, and all such improvements and variations should fall within the scope of the disclosure and the appended claims.

What is claimed is:

1. A quantum dot white light-emitting diode, comprising:
a cathode,
an anode, and
a light-emitting layer disposed between the cathode and the anode; wherein:
the light-emitting layer includes: a blue fluorescent organic layer, a spacer layer, and a quantum dot light-emitting layer; wherein:
the blue fluorescent organic layer is disposed near the cathode side, the quantum dot light-emitting layer is disposed near the anode side, and the spacer layer is disposed between the blue fluorescent organic layer and the quantum dot light-emitting layer;
a material of the quantum dot light-emitting layer contains quantum dots, a material of the blue fluorescent organic layer contains a blue fluorescent organic material, and a material of the spacer layer contains a spacer material; and
a triplet exciton energy of the spacer material is greater than a triplet exciton energy of the blue fluorescent organic material, and a triplet exciton energy of the spacer material is greater than a quantum dot exciton energy.

2. The quantum dot white light-emitting diode according to claim 1, wherein:
the material of the spacer layer is a mixed material composed of a first n-type semiconductor material and a first p-type semiconductor material, or a first bipolar material having both electron and hole transport capabilities.

3. The quantum dot white light-emitting diode according to claim 1, wherein a thickness of the spacer layer is 3-10 nm.

4. The quantum dot white light-emitting diode according to claim 2, wherein:
the first bipolar material is one or both of: CBP and NPB; or
the first n-type semiconductor material includes at least one of: TPBi, Bepp2, BTPS, and TmPyPb; or
the first p-type semiconductor material includes at least one of: TAPC, mCP, and TCTA.

5. The quantum dot white light-emitting diode according to claim 1, wherein:
the blue fluorescent organic material includes at least one of: 4P-NPD, Cz-2pbb, POTA, and DADBT; and
a thickness of the blue fluorescent organic layer is 5-30 nm.

6. The quantum dot white light-emitting diode according to claim 1, wherein: the blue fluorescent organic layer material includes a first host material and a blue fluorescent organic material doped in the first host material, a singlet exciton energy of the first host material being greater than a singlet exciton energy of the blue organic fluorescent material, and a triplet exciton energy of the first host material being greater than a triplet exciton energy of the blue fluorescent organic material.

7. The quantum dot white light-emitting diode according to claim 6, wherein:
a thickness of the blue fluorescent organic layer is 10-50 nm; and
the quantum dot light-emitting layer material includes quantum dots and a second host material, a singlet exciton energy and a triplet exciton energy of the second host material being greater than an exciton energy of the quantum dot.

8. The quantum dot white light-emitting diode according to claim 7, wherein:
the first host material is selected from one of: a second bipolar material, a second n-type semiconductor material, and a mixed material composed of the second n-type semiconductor material and a second p-type semiconductor material; and
the second host material is selected from one of: a third bipolar material, a third p-type semiconductor material, and a mixed material composed of the third n-type semiconductor material and a third p-type semiconductor material.

9. The quantum dot white light-emitting diode of claim 8, wherein:
the first host material is the second n-type semiconductor material, and the second host material is the third p-type semiconductor material; or
the first host material is the mixed material composed of the second n-type semiconductor material and the second p-type semiconductor material, and the second host material is the third p-type semiconductor material; or
the first host material is the second n-type semiconductor material, and the second host material is the mixed material composed of the third n-type semiconductor material and the third p-type semiconductor material; or
the first host material is the second bipolar material, and the second host material is the third bipolar material; or
the first host material is the mixed material composed of the second n-type semiconductor material and the second p-type semiconductor material; the second host material is the mixed material composed of the third n-type semiconductor material and the third p-type semiconductor material.

10. The quantum dot white light-emitting diode according to claim 8, wherein:
the second n-type semiconductor material includes at least one of: TPBi, Bepp2, BTPS, and TmPyPb; or
the third n-type semiconductor material includes at least one of: TPBi, Bepp2, BTPS, and TmPyPb; or
the second p-type semiconductor material includes at least one of: TAPC, mCP, and TCTA; or, the third p-type semiconductor material includes at least one of: TAPC, mCP, and TCTA; or, the second bipolar material includes at least one of CBP and NPB; or, the third bipolar material includes at least one of CBP and NPB.

11. The quantum dot white light-emitting diode according to claim 1, wherein:
in response to the triplet exciton energy of the blue fluorescent organic material being greater than 2.38 eV, the quantum dots are yellow quantum dots, or mixed quantum dots composed of red quantum dots and green quantum dots, or mixed quantum dots including the red quantum dots, the yellow quantum dots and the green quantum dots, a half-wave width of luminescent spectrum of the yellow quantum dot being greater than 70 nm.

12. The quantum dot white light-emitting diode according to claim 1, wherein:
in response to a triplet exciton of the blue fluorescent organic material being 2.25 eV-2.38 eV, the quantum dots are yellow quantum dots, or mixed quantum dot composed of red quantum dots and the yellow quantum dots, a half-wave width of luminescent spectrum of the yellow quantum dots being greater than 70 nm.

13. The quantum dot white light-emitting diode according to claim 11, wherein:
the quantum dot light-emitting layer is a red quantum dot film layer and a green quantum dot film layer that are stacked, a thickness of the red quantum dot film layer and the green quantum dot film layer being 5-15 nm; or
the quantum dot light-emitting layer is a single mixed film layer formed by mixing the red quantum dots and the green quantum dots, a thickness of the single mixed film layer being 10-30 nm; or, the quantum dots are the yellow quantum dots, a thickness of the quantum dot light-emitting layer being 5-50 nm; or
the quantum dots are mixed quantum dots including the red quantum dots, the yellow quantum dots, and green quantum dots, a thickness of the quantum dot light-emitting layer being 15-50 nm; or
the quantum dot light-emitting layer is stacked by a red quantum dot film layer, a yellow quantum dot film layer and a green quantum dot film layer, a thickness of the red quantum dot film layer, the yellow quantum dot film layer and the green quantum dot film layer being 5-15 nm.

14. The quantum dot white light-emitting diode according to claim 12, wherein:
the quantum dots are the yellow quantum dot, a thickness of the quantum dot light-emitting layer being 5-50 nm; or
the quantum dots are a single mixed film layer formed by mixing the red quantum dots and the yellow quantum dots, a thickness of the single mixed film layer being 10-50 nm; or
the quantum dot light-emitting layer is stacked by the red quantum dot film layer and the yellow quantum dot film layer, a thickness of the red quantum dot film layer and the yellow quantum dot film layer being 5-15 nm.

15. A quantum dot white light-emitting diode, comprising:
a cathode,
an anode, and
a light-emitting layer disposed between the cathode and the anode; wherein:
the light-emitting layer includes a blue fluorescent organic layer and a quantum dot light-emitting layer that are stacked; and
the blue fluorescent organic layer material includes a first host material formed by mixing a first p-type semiconductor material and a first n-type semiconductor material and a blue organic fluorescent material doped in the first host material, a singlet exciton energy of the first host material being greater than a singlet exciton energy of the blue organic fluorescent material, and a triplet exciton energy of the first host material being greater than a triplet exciton energy of the blue organic fluorescent material.

16. The quantum dot white light-emitting diode according to claim 15, wherein:
a doping concentration of the blue organic fluorescent material is 0.5-3%; and
the quantum dot light-emitting layer material includes the quantum dots and a second host material, and a singlet exciton energy and a triplet exciton energy of the second host material are both greater than the quantum dot exciton energy.

17. The quantum dot white light-emitting diode according to claim 15, wherein:
an electron transport layer is further disposed between the cathode and the light-emitting layer, the blue fluorescent organic layer is disposed near one side of the electron transport layer; a material of the electron transport layer is the same as at least one of the first n-type semiconductor materials of the blue fluorescent organic layer material, and
a hole transport layer is further disposed between the anode and the light-emitting layer, and the blue fluorescent organic layer is disposed near one side of the hole transport layer; a material of the hole transport layer is the same as at least one of the first p-type semiconductor materials of the blue fluorescent organic layer material.

18. The quantum dot white light-emitting diode according to claim 15, wherein: the blue fluorescent organic layer is disposed near the anode side, the quantum dot layer is disposed near the cathode side; and the second host material is selected from one of: a first bipolar material, a second n-type semiconductor material, a second p-type semiconductor material, and a mixed material composed of the second n-type semiconductor material and the second p-type semiconductor material.

19. The quantum dot white light-emitting diode according to claim 15, wherein the blue fluorescent organic layer is disposed near the cathode side, the quantum dot light-emitting layer is disposed near the anode side; and the second host material is selected from one of: a first bipolar material, a second n-type semiconductor material, a second p-type semiconductor material, and a mixed material composed of the second n-type semiconductor material and the second p-type semiconductor material; or, the blue fluorescent organic layer is disposed near the cathode side, the quantum dot light-emitting layer is disposed near the anode side, and the second host material is selected from one of: a first bipolar material, a second n-type semiconductor material, a second p-type semiconductor material, a mixed material composed of the second n-type semiconductor material and the second p-type semiconductor material.

20. The quantum dot white light-emitting diode according to claim 15, wherein:
when the triplet exciton energy of the blue organic fluorescent material is greater than 2.38 eV, the quantum dots are yellow quantum dots, or the quantum dots are formed by mixing red quantum dots and green quantum dots, or the quantum dots are mixed quantum dots including the red quantum dots, the yellow quantum dots and the green quantum dots, a half-wave width of the luminescent spectrum of the yellow quantum dot being greater than 70 nm; wherein:
the quantum dot light-emitting layer is stacked by a red quantum dot film layer and a green quantum dot film layer, and a thickness of the red quantum dot film layer and the green quantum dot film layer is 5-15 nm, or,
the quantum dot light-emitting layer is a single mixed film layer formed by mixing the red quantum dots and the green quantum dots, and a thickness of the single mixed film layer is 10-30 nm; or, the quantum dots are yellow quantum dots, and a thickness of the quantum dot light-emitting layer is 5-50 nm; or
the quantum dots are mixed quantum dots including the red quantum dots, the yellow quantum dots, and the green quantum dots, and a thickness of the quantum dot light-emitting layer is 15-50 nm; or the quantum dot light-emitting layer is stacked by the red quantum dot film layer, the yellow quantum dot film layer and the green quantum dot film layer, and a thickness of the red quantum dot film layer, the yellow quantum dot film layer and the green quantum dot film layer is 5-15 nm; and when the triplet exciton of the blue organic fluorescent material is 2.25 eV-2.38 eV, the quantum dots are yellow quantum dot, or the quantum dots are mixed quantum dots composed of red quantum dots and the yellow quantum dots, a the half-wave width of the luminescent spectrum of the yellow quantum dot being greater than 70 nm; wherein:

the quantum dots are yellow quantum dot, and a thickness of the quantum dot light-emitting layer is 5-50 nm; or, the quantum dot is a single mixed film layer formed by mixing red quantum dots and yellow quantum dots, and the thickness of the single mixed film layer is 10-50 nm; or, the quantum dot light-emitting layer is stacked by the red quantum dot thin film layer and the yellow quantum dot thin film layer, and a thickness of the red quantum dot thin film layer and the yellow quantum dot thin film layer is 5-15 nm.

\* \* \* \* \*